(12) United States Patent
Chang

(10) Patent No.: US 7,505,325 B2
(45) Date of Patent: Mar. 17, 2009

(54) LOW VOLTAGE LOW CAPACITANCE FLASH MEMORY ARRAY

(75) Inventor: Shang-De Chang, Fremont, CA (US)

(73) Assignee: Chingis Technology Corporation, San Jose, CA (US)

( * ) Notice: Subject to any disclaimer, the term of this patent is extended or adjusted under 35 U.S.C. 154(b) by 240 days.

(21) Appl. No.: 11/540,319

(22) Filed: Sep. 28, 2006

(65) Prior Publication Data

US 2008/0080247 A1    Apr. 3, 2008

(51) Int. Cl.
*G11C 11/34* (2006.01)
*G11C 16/06* (2006.01)
(52) U.S. Cl. .............................. 365/185.18; 365/185.14; 365/94; 365/185.33
(58) Field of Classification Search ............ 365/184.14, 365/185.18, 94, 104, 185.33, 185.14
See application file for complete search history.

(56) References Cited

U.S. PATENT DOCUMENTS

| 6,266,274 | B1 * | 7/2001 | Pockrandt et al. ...... | 365/185.17 |
| 6,307,781 | B1 * | 10/2001 | Shum ..................... | 365/185.17 |
| 2004/0213046 | A1 * | 10/2004 | Yoshida ................. | 365/185.14 |
| 2006/0114719 | A1 * | 6/2006 | Lee ....................... | 365/185.17 |

* cited by examiner

*Primary Examiner*—Tuan T Nguyen
*Assistant Examiner*—Toan Le
(74) *Attorney, Agent, or Firm*—Haynes and Boone

(57) ABSTRACT

In a p-type flash memory array, separate programming and read bit lines are provided. The programming bit line is used only to program the floating gate transistors in the memory cells connected to that bit line. The read bit line is used only to read the state of a floating gate transistor in a selected memory cell connected to that bit line during the operation of the memory circuit. The resulting structure allows the use of low voltages during both programming and operation of the memory array. This makes possible the use of transistors in the memory array with feature sizes less than, for example, 0.18 microns. At the same time variable, unpredictable capacitances associated with each bit line in prior art p-type flash memory structures using comparable low programming voltages are eliminated when a particular memory cell attached to that bit line is being read out.

14 Claims, 4 Drawing Sheets

LOW VOLTAGE LOW CAPACITANCE FLASH MEMORY ARRAY

FIELD OF THE INVENTION

This invention relates to flash memory arrays and in particular to a flash memory array which is capable of operating with both relatively low programming voltages and a low, predictable readout capacitance.

BACKGROUND

A certain type of flash memory array uses a p-channel MOS transistor as the storage element and a p-channel MOS transistor as the control element in each memory cell. This type of flash memory can have a large number of memory cells, for example, 2 million or 4 million such cells arranged typically in a 1K by 2K or 1K by 4K configuration. Each memory cell will contain a control transistor and a floating gate transistor. The floating gate of the floating gate transistor will be programmed to either contain a charge (which typically will turn on the floating gate transistor) or no charge (which typically will leave off the floating gate transistor). Thus binary information (i.e. a one ("1") or a zero ("0") can be stored in the floating gate transistor.

Small portions of two typical prior art flash memory arrays are illustrated in FIGS. 1c and 1d. FIGS. 1c and 1d each show an array of memory cells with control transistors Q11 through QRC (where R equals the number of rows in the array, C equals the number of columns in the array and RC equals the number of memory cells in the array) and floating gate transistors F11 through FRC. Each control transistor Qrc (where $1 \leq r \leq R$ and $1 \leq c \leq C$) is associated with a corresponding floating gate transistor Frc in a memory cell rc. Floating gate transistors F11 through FRC are shown in the arrays of FIGS. 1c and 1d. Each floating gate transistor Frc contains a floating gate (139 in FIG. 1c and 149 in FIG. 1d) which will store or not store charge depending upon the information to be stored in each memory cell.

FIG. 1a shows in cross section the structure of a typical P-type transistor Q11. In FIG. 1a, P-type regions 102a and 102b are formed, typically by ion implantation, in an N-type substrate or N well 101. P-type regions 102a and 102b are separated from each other by a channel region 103 the conductivity type of which can be changed by a voltage applied to control gate 106 through conductive lead 107 in ohmic contact with gate 106. Gate insulation 105 is formed between control gate 106 and the underlying channel region 103.

The source of a P-type transistor is that one of the P-type regions 102a and 102b which is at a higher voltage than the other P-type region 102 when the P-type transistor is being used. Thus, during one operation, a given p-type region 102 might be the source of the p-type transistor. During another operation this same p-type region might be the drain of the p-type transistor. Typically, during programming, the control transistor Qrc and the floating gate transistor Frc will each have one p-type region be the source and the other p-type region be the drain whereas during readout of information stored on the floating gate transistor, the source and drain of each of these transistors can, in some embodiments, be reversed.

FIG. 1b shows a cross section of a typical MOS P-channel floating gate transistor 100b. The regions within floating gate transistor 100b which are identical in structure to the regions within control transistor 100a are identically numbered. Floating gate transistor 100b includes a floating gate 116 which is insulated from the underlying channel region 103 by gate insulation 105 and to which no other conductor is attached. During the charging of floating gate 116, current will flow from the source region of the floating gate transistor into the channel region 103 and electrons will be diverted through the gate insulation 105 onto the floating gate 116 as a result of a phenomenon known as hot electron injection or Fowler-Nordheim tunneling or both. As a result, electrons are placed on floating gate 116. Should the charge created by these electrons be sufficiently high, these electrons will cause inversion of the underlying channel region 103 from N-type to P-type thus providing a conductive path between the P-type regions 102a and 102b. When this conductive path exists in a given floating gate transistor Frc in a memory cell rc (see FIGS. 1c and 1d), and the control transistor Qrc in that memory cell rc is turned on, a current will flow through memory cell rc if a voltage drop is created across memory cell rc. The current will indicate the nature of the information stored in the memory cell rc. If no charge has been placed on the floating gate 116 of floating gate transistor Frc (100b in FIG. 1b), then no current will flow through memory cell rc when a voltage is placed across memory cell rc and control transistor Qrc is turned on. Thus a binary one ("1") or zero ("0") is stored in each memory cell rc and the state of the memory cell is detected by the presence or absence of current when a voltage is placed across the memory cell and the control transistor Qrc is turned on.

Typically, to program a floating gate transistor such as F11 (FIG. 1c), a minus eight (−8) volts programming voltage is applied to the gate 133-11 of control transistor Q11 from X-decoder 132 by means of lead 137-1. Simultaneously, minus five (−5) volts is applied from Y-line decoder 131 by means of lead 136-1 to P-type region "b" of P-type transistor Q11. Row interconnect 137-1 connects and thus applies the same voltage to the gates of all control transistors in row 137-1 which is minus eight (−8) volts during programming of one or more memory cells connected to the row. However, if only F11 is being programmed, only the column line 136-1 will be placed at minus five (−5) volts. Thus, P-type transistor Q11 turns on and conducts current and causes P-type region "b" of floating gate transistor F11 to be slightly above approximately minus five (−5) volts due to the voltage drop across channel 103 of Q11. Because interconnect 138-1 is at ground potential, during programming P-type region "a" of floating gate transistor F11 acts as a source as does P-type region "a" of control transistor Q11. The P-type regions denoted "b" of control transistor Q11 and of floating gate transistor F11 will act as drains. With the voltages as described, current will flow from grounded lead 138-1 to lead 136-1 at minus five (−5) volts. This current will cause electrons to flow onto floating gate 139-11 of F11 thus creating a negative charge on this gate. This negative charge will cause the channel region 103 of floating gate transistor F11 to invert. Inverted channel 103 will allow current to flow between P region "a" and P region "b" of F11 should control transistor Q11 subsequently be turned on during subsequent readout of memory cell 11.

The minus eight (−8) volts required to turn on control transistor Q11 during the programming of floating gate transistor F11 is larger in absolute magnitude than the control transistor can sustain if the control transistor is manufactured using feature sizes under 0.18 microns. Accordingly, it is necessary to provide a structure which will allow the programming of floating gate transistors (such as F11) in the array of FIG. 1c using a gate voltage on the control transistors (such as gate 133-11 on Q11) smaller in absolute magnitude than eight (8) volts.

Note that when minus eight (−8) volts is applied to interconnect 137-1 and all the other control gates 133-12 (not shown) through 133-1C connected to interconnect 137-1 are at minus eight (−8) volts, the control transistors Q12 (not shown) through Q1C turn on but do not conduct current because the voltages on their column lines 136-2 (not shown) through 136-C are kept at zero (0) volts, the same as the voltage on grounded lead 138-1.

To read out the signal stored on floating gate transistor F11 during normal operation of the memory array, a voltage of minus three (−3) volts is applied to the control gate 133-11 of control transistor Q11 while a voltage of minus one point five (−1.5) volts is applied to column interconnect 136-1. Transistor Q11 turns on and current then flows from grounded interconnect 138-1 through floating gate transistor F11 because floating gate transistor F11 has had its channel region 103 inverted as a result of the electrons stored on floating gate 139-11. This current then passes through turned-on control transistor Q11 and is detected by the sense amp 130-1 (not shown) in sense amp block 130 connected to column line 136-1. The other transistors in row 137-1 which have their gates also held at minus three (−3) volts will not have a current flowing through them because their corresponding column lines 136-2 (not shown) through 136-C are held at zero (0) volts, the same as the voltage on grounded interconnect 138-1.

In one embodiment, all the memory cells connected to a given row can be read out simultaneously by having the bit lines 136-1 to 136-C brought to minus one point five (−1.5) volts. Each bit line 136-$i$ is connected to a sense amp 130-$i$ in sense amp block 130 thus allowing the states of the memory cells 11 to 1C to be read out simultaneously.

The alternative prior art structure shown in FIG. 1$d$ allows programming of each floating gate transistor in the memory array with a lower voltage but results in an unpredictable increase in the capacitance sensed on the column line (i.e. the bit line) when reading out a floating gate transistor. This slows down the read out of data from each memory cell. As shown in FIG. 1$d$, this particular structure has floating gate transistor F11 with a P-type region "b" connected to column line 146-1 and P-type region "a" connected in series with P-type region "b" of control transistor Q11. P-type region "a" of control transistor Q11 is connected to grounded interconnect 148-1.

To program the floating gate transistor F11 in memory cell 11 of the memory cell array in FIG. 1$d$, the floating gate transistor F11 has its drain "b" held to about minus five (−5) volts by the voltage on column 146-1 being brought to minus five (−5) volts through Y-line decoder 141. Source "a" of floating gate transistor F11 is connected to drain "b" of control transistor Q11 and source "a" of control transistor Q11 is connected to grounded (i.e. at zero volts) interconnect 148-1. A minus two (−2) volt potential is then applied to the gate 143-11 of select transistor Q11 from X-decoder 142 by means of row line 147-1. This same minus two (−2) volts is also applied to the gates 143 of all other control transistors Q1$c$ connected to row line 147-1. Consequently, current flows from the source "a" of Q11 through Q11 to source "a" of floating gate transistor F11. This current passes through turned-on floating gate transistor F11 and some of the electrons from this current then charge the floating gate 149-11 of floating gate transistor F11 thereby resulting in a negative charge being stored on floating gate 149-11. Consequently, the channel region 103 underlying floating gate 149-11 is inverted resulting in current being capable of passing through floating gate transistor F11 whenever control transistor Q11 is turned on and a voltage is applied across the memory cell.

The prior art structure shown in FIG. 1$d$ requires less of a voltage range to turn on and charge the floating gate of transistor F11 than the structure shown in FIG. 1$c$. However, in the embodiment of FIG. 1$d$, each floating gate transistor Frc which is turned on and attached to column 146-$c$ (only columns 146-1 and 146-C are shown in FIG. 1$d$), allows the capacitance of that floating gate transistor to affect the turn-on speed of the sense amp 140-$c$ in sense amp block 140 attached to that column. The sense amp 140-$c$ attached to column 146-$c$ senses the current through the floating gate transistor in the memory cell attached to that column being read. However, the speed of this sense amp 140-$c$ is affected by the capacitances of all other floating gate transistors Frc with an inverted channel attached to that column.

For example, to read the state of a given memory cell in the memory array of FIG. 1$d$ such as memory cell 11 made up of floating gate transistor F11 and select transistor Q11, minus three (−3.0) volts is applied from row line 147-1 to the gate 143-11 of transistor Q11 to turn on Q11. Minus one point five (−1.5) volts is applied from Y line decoder 141 to column line 146-1. Since lead 148-1 is grounded, a current will flow through transistor Q11 and floating gate transistor F11 (which has been turned on by the charge stored on floating gate 149-11). The sense amp 140-1 in sense amp structure 140 connected to column lead 146-1 will detect this current. If floating gate 143-11 contains no charge, then no current will flow through floating gate transistor F11 and no current will flow out to bit line 146-1 and no current will be detected by sense amp 140-1. The other cells attached to row line 147-1 with minus three (−3) volts applied thereto will remain off because their column lines 146-2 through 146-C will, in one embodiment, be maintained at zero volts during the reading of memory cell 11 attached to column line 146-1. However, if desired, all memory cells connected to row line 147-1 can be read out simultaneously.

In the memory array of FIG. 1$c$, the sense amp reading out the signal is impacted by only one channel capacitance, namely the channel capacitance associated with the control transistor of the floating gate transistor being read. For example, if there are 1,000 rows in the memory array, the sense amp senses only the channel capacitance associated with the control transistor connected to the bit line and turned on by the negative voltage on its row line and not the other 999 capacitances associated with the other 999 control transistors.

In the second prior art embodiment described above in FIG. 1$d$, the bit line capacitance is not fixed. The capacitance of a bit line can vary depending upon how many floating gate transistors Frc which are attached to the bit line have been programmed to be on because each turned-on floating gate transistor introduces additional capacitance to the bit line. The embodiment described in FIG. 1$c$ above is more stable but the embodiment of FIG. 1$d$ uses lower programming voltages so there is a trade-off between which embodiment to use.

Accordingly, it would be desirable to have the advantages of both of the prior art embodiments in one given structure. In particular, it would be desirable to have a structure which would provide both the low voltage capability of the prior art embodiment described in FIG. 1$d$ together with the low capacitance of the embodiment described in FIG. 1$c$ when a memory cell is being read.

SUMMARY OF THE INVENTION

In accordance with this invention, a structure is provided which provides both low capacitance when a memory cell is being read while allowing the use of low voltages on the order of the voltages available in the second prior art embodiment described above. In one embodiment, this is achieved by having a separate programming bit line, which is used to program the floating gate transistors in the memory cells connected to that bit line, together with a separate read bit line which is used to read the state of a floating gate transistor in a selected memory cell connected to that bit line during the operation of the memory circuit.

The invention makes possible the use of low voltages which allow the use of transistors in the memory array with feature sizes less than for example 0.18 microns. At the same time this invention eliminates the variable, unpredictable capacitance that can be associated with each bit line in the prior art structure using such low voltages when a particular memory cell attached to that bit line is being read out.

This invention will be more fully understood in conjunction with the following detailed description taken together with the drawings.

DETAILED DESCRIPTION

The following description is illustrative only and not limiting. Other embodiments of this invention will be obvious to those skilled in the art in view of the following detailed description.

Figure 1A:
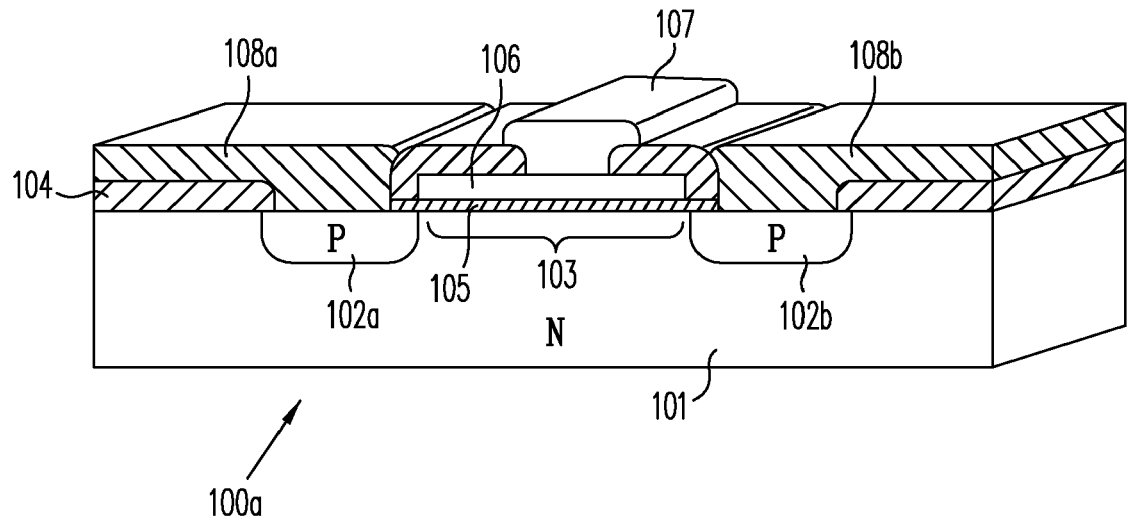
FIGS. 1a and 1b show in cross-section a typical P-channel transistor and a typical P-channel floating gate transistor, respectively.
Figure 1B:
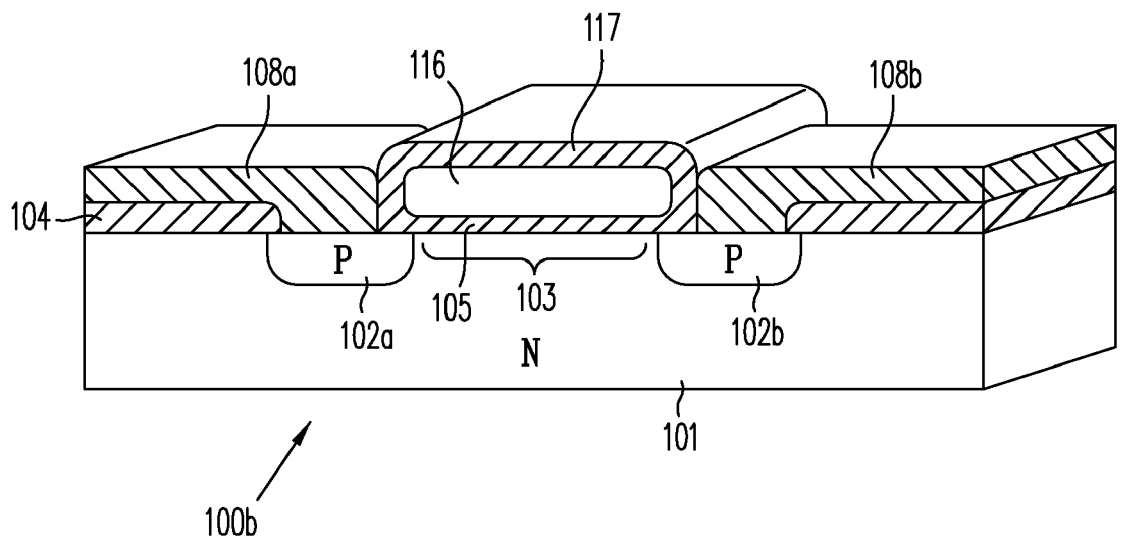
Figure 1C:
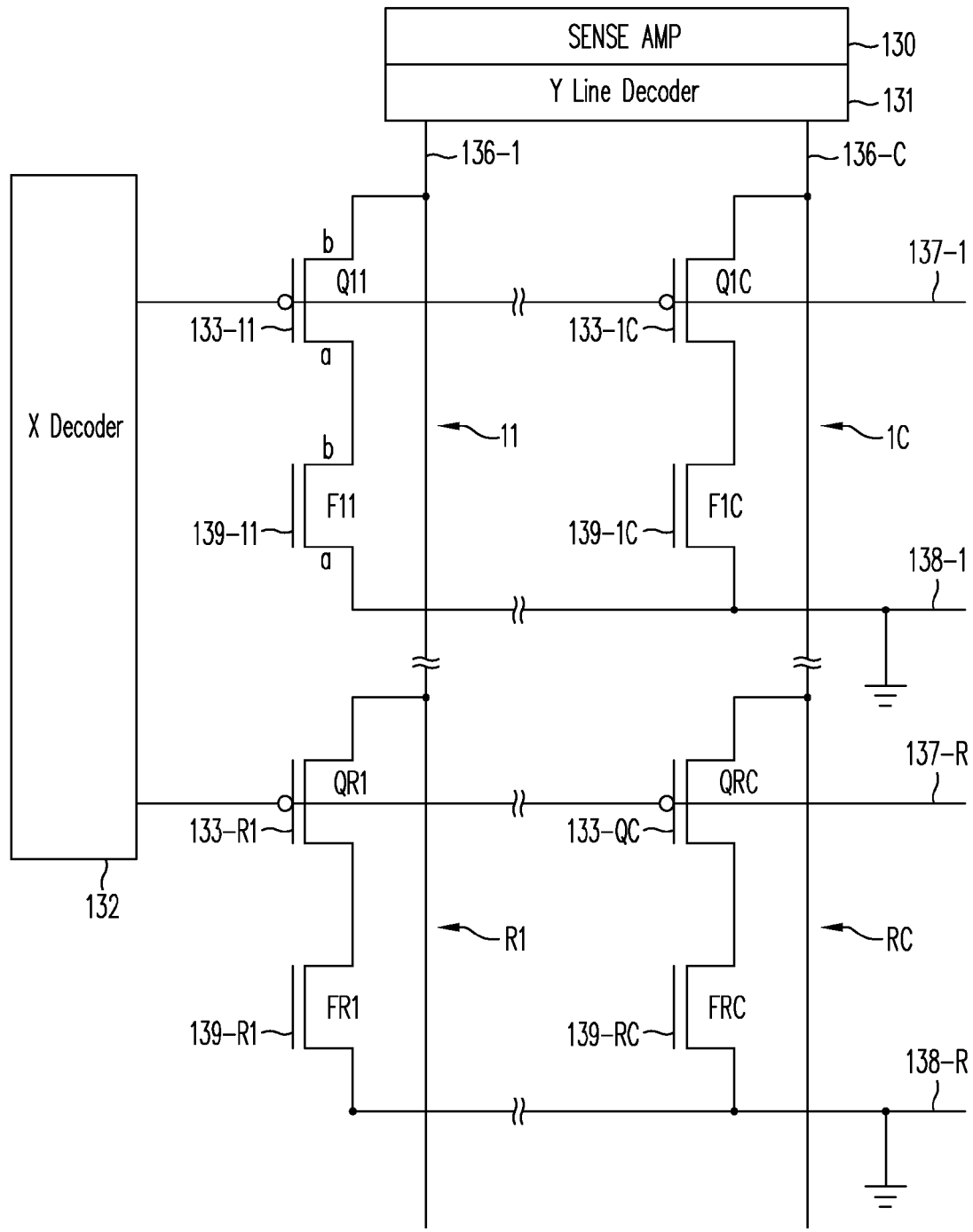
FIGS. 1c and 1d show two prior art P-channel flash memory arrays one of which provides a low capacitance readout of a memory cell and the other of which allows the memory cell to be read out with low voltage but with variable capacitance depending upon the states of the various floating gate transistors attached to the bit line associated with the memory cell being read out.
Figure 2:
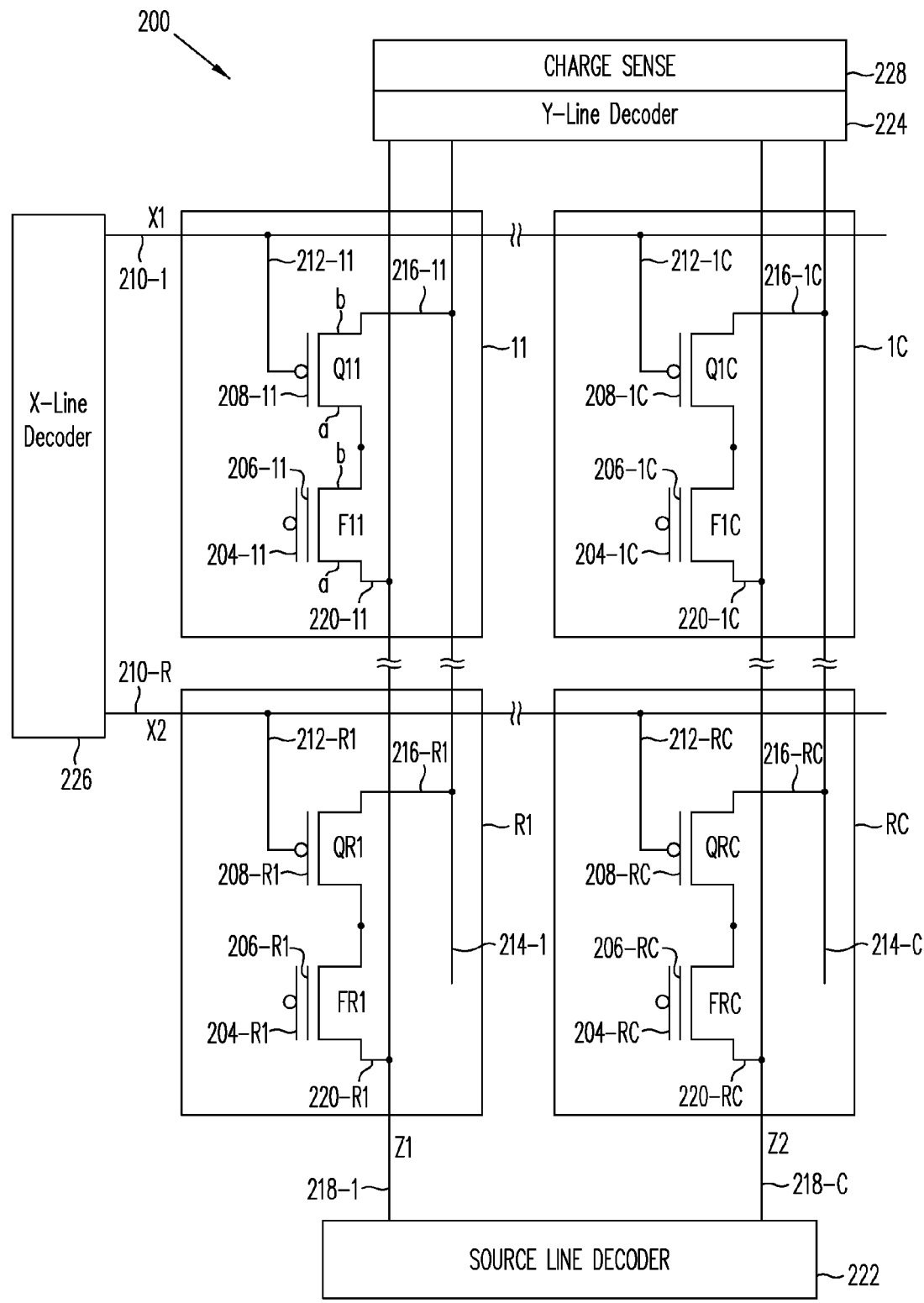
FIG. 2 shows the structure of this invention which provides a stable capacitance on the bit line during read out of the memory cell and which allows low voltages to be used to program each memory cell.

Referring to FIG. 2, in one embodiment of this invention source line decoder 222 provides a desired programming voltage to each programming bit line 218-c during the programming of each floating gate transistor Frc in the memory array. To program the floating gate transistor F11 associated with memory cell 11, a voltage of approximately minus three (−3) volts is applied from X-line decoder 226 on leads 210-1 and 212-11 to the gate 208-11 of control transistor Q11. This −3 volts turns on transistor Q11. At the same time, a programming voltage of minus six (−6) volts is applied to P-region "a" of floating gate transistor F11 by a voltage from source line decoder 222 applied through programming bit line 218-1 and lead 220-11. This programming voltage is typically −6 volts. This −6 volts is at least two (2) volts less than would be required in the prior art embodiment of FIG. 1c which, as described above, requires −8 volts for programming. The voltage on read bit line 214-1 will be held at zero (0) volts during the programming of F11. Thus, the P-type region "b" of control transistor Q11 will be kept at zero volts while the P-type region "a" of floating gate transistor F11 is at −6 volts. A current will thus pass through transistor Q11 which current will provide electrons to program the floating gate 206-11 of floating gate transistor F11. The control gate 204-11 on transistor F11 is not connected to a voltage source and is allowed to float. During programming, P-regions "b" of Q11 and F11 act as sources and P-regions "a" of Q11 and F11 act as drains.

During operation (after programming) to read out the state of floating gate transistor F11, the voltage from source line decoder 222 applied to programming bit line 218-1 is held at zero (0) volts and the voltage on read bit line 214-1 is held at minus one point five (−1.5) volts. To turn on select transistor Q11, minus three (−3) volts is applied to its gate 208-11 through row interconnect (sometimes called "row conductor") 210-1 and conductive lead 212-11 from X-line decoder 226. The use of minus three (−3) volts from X-line decoder 226 for both programming and for reading simplifies the circuitry in X-line decoder 226 and thus provides economies of scale and size. In particular, as the feature sizes of the transistors Qrc and Frc in each memory cell rc go to 0.18 microns or below, the transistors Qrc are less able to sustain minus eight (−8) volts on their gates 208. Therefore this invention solves the problem of shrinking the size of P-channel flash memories while at the same time having the same memory cell count. For example, a typical array made using this invention with 0.18 micron or smaller technologies may include four (4) million memory cells arranged in a 1,000 by 4,000 configuration.

If desired a lower voltage can be applied to the control gate 208-11 during read out than during programming. This will save power but slow slightly the operation of the array.

Figure 1D:
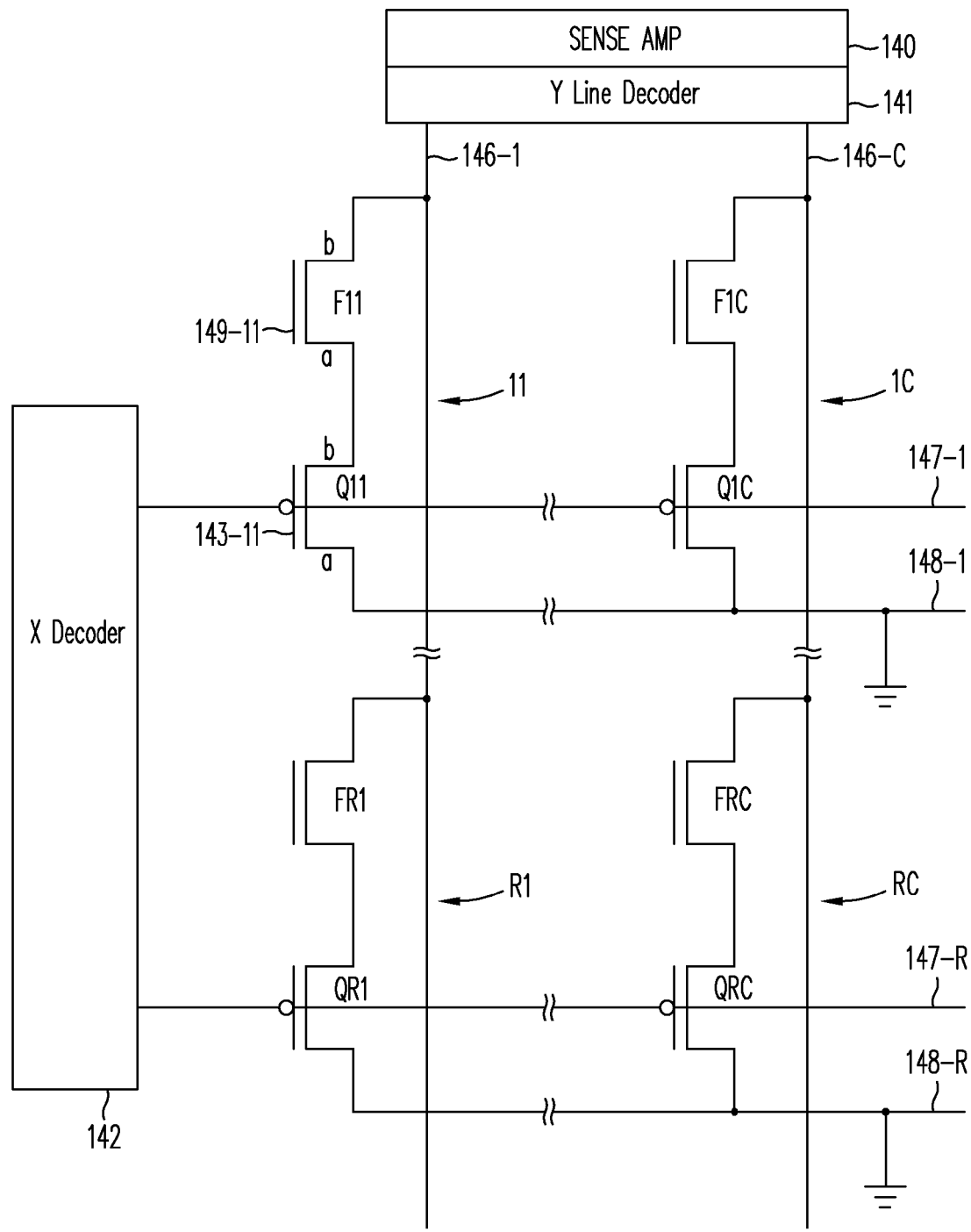

In the described embodiment, the reading out of more than one capacitance associated with a floating gate transistor during the reading of the charge stored on a particular memory cell in the memory array as described above in conjunction with FIG. 1d is avoided. This is because the zero voltage applied to a programming bit line such as bit line 218-1 during the reading out of any floating gate transistor Fr1 in memory cell r1 connected to programming bit line 218-1 results in all of the select transistors Qr1 in the non-selected memory cells connected to the same read bit line 214-1 having minus one point five (−1.5) volts connected through lead 214-1 to their P-type region "b". However, the voltages on the gates 208-r1 of the unselected control transistors Qr1 supplied from X-line decoder 226 will be zero (0). Therefore, the unselected control transistors Qr1 remain off. During readout, the P-type regions "a" of the floating gate transistors Fr1 will be at zero (0) volts, the voltage on programming line 218-1. Therefore, the control transistors Qr1 associated with the floating gate transistors Fr1 in the unselected memory cells r1 connected to the same programming bit line 218-1 will be off during reading of a given memory cell connected to that bit line and the channel capacitances associated with these floating gate transistors will not affect the sense amp 228-1 connected to read bit line 214-1 in the charge sense circuitry 228. Accordingly, the sense amplifier 228-1 (not shown) in charge sense block 228 connected to read bit line 214-1 will sense only the capacitance associated with F11 because transistor Q11 has been turned on with minus three (−3) volts on its control gate and minus one point five (−1.5) volts on its drain "b" (which was Q11's source during programming).

Accordingly, this invention allows both a lower voltage to be applied and used with the flash memory while at the same time avoiding the presence of excess and unpredictable capacitance on the column line (i.e. the bit line) during the read out of the state of a memory cell. The p-channel transistors used with this invention each contain first and second p-type regions (which can function either as sources or drains depending upon the relative magnitudes of the voltages applied to these regions). As described above, these p-type regions are formed in an N-type substrate called an N-well.

The N-well is at a voltage which is applied to an N+ annular ring surrounding the memory array within the die in which the memory array is formed. This annular ring is typically formed by ion implanting n-type impurities into the surface of the die to provide a high conductivity region which then allows a voltage applied to the N+ region to be supplied to the N-well.

During programming, a high current is still required to program the floating gate transistor Frc in a memory cell rc. To achieve this programming, the typical current which must flow into the channel region of the floating gate transistor and thereby onto the floating gate of the floating gate transistor Frc would comprise typically around 80 microamps. This current would flow for about 10 microseconds during programming.

Other embodiments of this invention will be obvious in view of the above disclosure. Accordingly, the invention will be limited only as set forth in the attached claims.

What is claimed is:

1. A one time programmable memory array comprising:
   a read bit line;
   a programming bit line;
   a plurality of memory cells, each memory cell containing a control transistor and a floating gate transistor formed in a substrate, the control transistor and the floating gate transistor each having a first region and a second region of conductivity type opposite to the conductivity type of the substrate, said first region of the control transistor being connected to said read bit line and said second region of the control transistor being connected to said first region of the floating gate transistor, said second region of the floating gate transistor being connected to said programming bit line;
   a first source for providing a first voltage to said programming bit line during the programming of a floating gate transistor connected to said programming bit line and for providing a second voltage to said programming bit line during the reading of the memory cell containing said floating gate transistor; and
   a second source connected to said read bit line for supplying a third voltage to said first region of the control transistor in said memory cell during the programming of the floating gate transistor in said memory cell and for providing a fourth voltage to said first region of said control transistor during the reading of said floating gate transistor.

2. The array of claim 1 wherein:
   said programming bit line connected to said second region of each floating gate transistor arranged along said programming bit line is capable of carrying a first voltage for use in programming a floating gate transistor in the memory cell connected to said programming bit line and a second voltage to be applied to the second regions of all floating gate transistors during the reading of a floating gate transistor in a memory cell connected to said programming bit line.

3. A one-time programmable memory array comprising:
   C read bit lines, where C is a first selected integer;
   R row lines, where R is a second selected integer;
   C programming bit lines;
   a plurality of memory cells, each memory cell containing a control transistor and a floating gate transistor, wherein each of said plurality of memory cells is connected to a selected one of said read bit lines, a selected one of said row lines and a selected one of said programming bit lines;
   a first voltage source for supplying a first voltage to a selected one of said programming bit lines during the programming of a floating gate transistor connected to said selected one of said programming bit lines and for supplying a second voltage to said selected one of said programming bit lines during the reading out of one of the floating gate transistors connected to said selected one of said programming bit lines;
   a second voltage source for supplying a first gate voltage to the control transistors connected to a given row line during the programming of one or more of the memory cells containing said control transistors connected to said row line and for providing a second gate voltage to said control transistors during the reading out of one or more of said memory cells connected to said row line; and
   a third voltage source connectable to each of said C read bit lines to provide a third voltage to a selected read bit line during the programming of the memory cells connected to said bit line and to provide a fourth voltage to said selected bit line during the reading out of a selected memory cell connected to said bit line.

4. The array of claim 3 wherein the control transistor and the floating gate transistor in each memory cell are p-type transistors.

5. The array of claim 4 wherein said first voltage is approximately minus six (−6) volts.

6. The array of claim 5 wherein said second voltage is approximately zero(0) volts.

7. The array of claim 6 wherein said first gate voltage is the same as said second gate voltage.

8. The array of claim 7 wherein said first and said second gate voltages are about minus three (−3) volts.

9. The array of claim 3 wherein said third voltage is zero (0) volts and said fourth voltage is a negative voltage.

10. The array of claim 9 wherein said fourth voltage is approximately minus one point five (−1.5) volts.

11. The method of operating a flash memory array containing a plurality of memory cells, with each memory cell being connected to a selected one of R row lines, a selected one of C read bit lines and a selected one of C programming bit lines, which comprises:
    programming a selected memory cell by:
      providing a first voltage to said memory cell on the programming bit line connected to said memory cell while providing a second voltage to said memory cell on the row line connected to said memory cell and while providing a third voltage to said memory cell on the read bit line connected to said memory cell; and
    reading out said memory cell by:
      providing a fourth voltage to said memory cell on the programming bit line connected to said memory cell while providing a fifth voltage to said memory cell on the row line connected to said memory cell and while providing a sixth voltage to said memory cell on the read bit line connected to said memory cell.

12. The method of claim 11 wherein said second voltage and said fifth voltage are the same.

13. The method of claim 11 wherein said first voltage is approximately minus six (−6) volts, said second voltage is approximately minus three (−3) volts, said third voltage is approximately zero (0) volts, said fourth voltage is approximately zero (0) volts, said fifth voltage is approximately minus three (−3) volts and said sixth voltage is approximately minus one point five (−1.5) volts.

14. The method of claim 11 wherein each memory cell comprises a p-type control transistor connected in series with a p-type floating gate transistor.

* * * * *